United States Patent
Lim

(10) Patent No.: US 8,714,532 B2
(45) Date of Patent: May 6, 2014

(54) ABSORBER AND APPARATUS FOR FABRICATING LIQUID CRYSTAL DISPLAY PANEL HAVING THE SAME

(75) Inventor: Jong-Go Lim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 1224 days.

(21) Appl. No.: 12/561,706

(22) Filed: Sep. 17, 2009

(65) Prior Publication Data

US 2010/0151764 A1 Jun. 17, 2010

(30) Foreign Application Priority Data

Dec. 17, 2008 (KR) .......................... 10-2008-128629

(51) Int. Cl.
*B23Q 1/25* (2006.01)
(52) U.S. Cl.
USPC .............................................. 269/21; 269/60
(58) Field of Classification Search
USPC ..................... 269/21, 55, 60, 225, 226, 240
See application file for complete search history.

(56) References Cited

U.S. PATENT DOCUMENTS

| | | | | |
|---|---|---|---|---|
| 3,801,090 | A * | 4/1974 | Gillen | 269/60 |
| 4,768,698 | A * | 9/1988 | Brown et al. | 228/18 |
| 5,820,116 | A * | 10/1998 | Haese | 269/21 |
| 6,796,014 | B2 * | 9/2004 | Sarh | 29/407.09 |
| 7,029,046 | B2 | 4/2006 | Lim | |
| 8,025,277 | B2 * | 9/2011 | Lin et al. | 269/55 |
| 8,136,802 | B2 * | 3/2012 | Cho | 269/21 |
| 2004/0074366 | A1 | 4/2004 | Choo et al. | |
| 2004/0130085 | A1 | 7/2004 | Lim | |
| 2007/0153217 | A1 | 7/2007 | Lee et al. | |
| 2010/0151764 | A1 * | 6/2010 | Lim | 445/66 |

FOREIGN PATENT DOCUMENTS

| | | |
|---|---|---|
| JP | 2007-210079 A | 8/2007 |
| KR | 10-2004-0456858 A | 6/2004 |
| KR | 10-0456858 B | 6/2004 |
| KR | 10-2007-0071270 A | 7/2007 |
| TW | 126382 | 1/1990 |
| TW | 565489 | 12/2003 |
| TW | 587504 | 5/2004 |
| TW | I238759 | 9/2005 |

OTHER PUBLICATIONS

Office Action issued in related Korean Patent Application No. 10-2008-0128629 dated May 28, 2013.
Office Action issued in related Taiwanese Patent Application No. 098129953 dated Oct. 30, 2012.

* cited by examiner

*Primary Examiner* — Lee D Wilson
(74) *Attorney, Agent, or Firm* — Morgan, Lewis & Bockius LLP

(57) ABSTRACT

Disclosed are an absorber, in which the positions of absorption pads are automatically adjusted according to sizes of substrates, and an apparatus for fabricating a liquid crystal display panel having the same. The absorber includes an absorption plate gate attached to a robot arm having a transfer hand through a turn unit; and an absorption unit assembly mounted on the lower surface of the absorption plate, and the absorption unit assembly includes a middle absorption unit; a left absorption unit located at the left side of the middle absorption unit; a right absorption unit located at the right side of the middle absorption unit; an absorption support unit to guide moving routes of the absorption units and fix the absorption units to the absorption plate; and absorption pads respectively formed on the absorption units such that the positions of the absorption pads are adjusted according to sizes of substrates to allow the absorption pads to absorb the substrates.

6 Claims, 5 Drawing Sheets

ABSORBER AND APPARATUS FOR FABRICATING LIQUID CRYSTAL DISPLAY PANEL HAVING THE SAME

This application claims the benefit of Korean Patent Application No. 2008-0128629, filed on Dec. 17, 2008, which is hereby incorporated by reference as if fully set forth herein.

BACKGROUND OF THE INVENTION

1. Field of the Invention

The present invention relates to an absorber to transfer a unit liquid crystal display panel, and more particularly, to an absorber, in which the positions of absorption pads are automatically adjusted according to the size of a liquid crystal display panel, and an apparatus for fabricating a liquid crystal display panel having the same.

2. Discussion of the Related Art

In general, a liquid crystal display device has a structure, in which a lower substrate provided with thin film transistors arranged thereon and an upper substrate provided with color filters formed thereon are bonded under the condition that a liquid crystal layer is interposed therebetween.

A process for fabricating one liquid crystal display panel by bonding the upper substrate and the lower substrate, as described above, is referred to as a cell process. The cell process includes an aligning step of forming alignment films to align liquid crystal on the lower substrate provided with the thin film transistors arranged thereon and the upper substrate provided with the color filters formed thereon in one direction, a bonding step of bonding the two substrates to maintain a designated cell gap, a sealing step of injecting liquid crystal into a space between the bonded upper and lower substrates, and a cell cutting step of dividing the bonded substrates into unit liquid crystal display panels using equipment called a cutting penetrable scriber (CPS). During the cell cutting step, a scribing step of cutting the bonded substrates into the unit liquid crystal display panels using the scriber, a step of separating the unit liquid crystal display panels from each other using a separation device and a transfer unit, and a grinding step are sequentially carried out. In such a cell cutting step, in order to separate the liquid crystal display panel from the substrates, passed through the scribing step, the unit liquid crystal display panel is absorbed by an absorber. The absorber used in this scribing step includes an absorption plate attached to a transfer hand robot arm, and a plurality of absorption pads located at designated intervals on the absorption plate. The absorption pads of the conventional absorber are fixed to the absorption plate, and thus absorbers having different sizes are manufactured according to sizes of liquid crystal display panels. That is, the conventional absorber is separately manufactured according to the model of a liquid crystal display panel, and causes an increase in the production cost of the liquid crystal display panel.

SUMMARY OF THE INVENTION

Accordingly, the present invention is directed to an absorber and an apparatus for fabricating a liquid crystal display panel having the same.

One object of the present invention is to provide an absorber, in which the positions of absorption pads are automatically adjusted according to sizes of liquid crystal display panels, and an apparatus for fabricating a liquid crystal display panel having the same.

To achieve this object and other advantages and in accordance with the purpose of the invention, as embodied and broadly described herein, an absorber includes an absorption plate attached to a robot arm having a transfer hand through a turn unit; and an absorption unit assembly mounted on the lower surface of the absorption plate, wherein the absorption unit assembly includes a middle absorption unit; a left absorption unit located at the left side of the middle absorption unit; a right absorption unit located at the right side of the middle absorption unit; an absorption support unit to guide moving routes of the absorption units and fix the absorption units to the absorption plate; and absorption pads respectively included on the absorption units such that the positions of the absorption pads are adjusted according to sizes of substrates to allow the absorption pads to absorb the substrates.

Each of the absorption units may include a motor; a timing belt driven according to the rotation of the motor; a ball screw rotated according to the driving of the timing belt; and first and second absorption pad fixing parts, to which the absorption pads are fixed, respectively located at both sides of the ball screw such that the positions of the first and second absorption pad fixing parts are varied according to the rotation of the ball screw.

The absorption support unit may include a first LM guide installed on the first absorption pad fixing part of the left absorption unit and the first absorption pad fixing part of the right absorption unit; a second LM guide installed on the second absorption pad fixing part of the left absorption unit and the second absorption pad fixing part of the right absorption unit; a first block installed on the upper surface of the left side of the first LM guide and being movable in the lengthwise direction of the first LM guide; a second block installed on the upper surface of the right side of the first LM guide and being movable in the lengthwise direction of the first LM guide; a third block installed on the upper surface of the left side of the second LM guide and being movable in the lengthwise direction of the second LM guide; a fourth block installed on the upper surface of the right side of the second LM guide and being movable in the lengthwise direction of the second LM guide; a third LM guide installed on the first and third blocks and being perpendicular to the first and second LM guides; and a fourth LM guide installed on the second and fourth blocks and being perpendicular to the first and second LM guides.

The absorption support unit may further include a first screw unit connected to the first absorption pad fixing part of the left absorption unit and the first absorption pad fixing part of the right absorption unit, and being parallel with the first and second LM guides; and a second screw unit connected to the second absorption pad fixing part of the left absorption unit and the second absorption pad fixing part of the right absorption unit, and being parallel with the first and second LM guides, and the first and second screw units may move the absorption pads connected to the first and second absorption pad fixing parts in the lengthwise direction of the first and second LM guides according to the sizes of the substrates.

The first and second screw units may move in the lengthwise direction of the third and fourth LM guides according to the sizes of the substrates by interlocking with the left and right absorption units.

The central portion of the first screw unit may be connected to the first absorption pad fixing part of the middle absorption unit, and the central portion of the second screw unit may be connected to the second absorption pad fixing part of the middle absorption unit.

The middle absorption unit out of the absorption units may further include fifth and sixth LM guides installed under the first and second absorption pad fixing parts, and being parallel with the ball screw; and a lower structure located under the fifth and sixth LM guides to fix the fifth and sixth LM guides.

In another aspect of the present invention, an apparatus for fabricating a liquid crystal display panel includes a scribing device to cut an upper substrate and a lower substrate, which are bonded under the condition that liquid crystal is interposed therebetween, into a plurality of unit liquid crystal display panels; and a transfer unit to transfer the liquid crystal display panel separated from the bonded substrates by the scribing device to a designated place, wherein the transfer unit includes a transfer hand robot arm; and an absorber connected to the robot arm and provided with absorption pads, the positions of which are adjusted according to the size of the unit liquid crystal display panel, to absorb the unit liquid crystal display panel.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Hereinafter, with reference to the accompanying drawings, an absorber and an apparatus for fabricating a liquid crystal display panel having the same in accordance with an embodiment of the present invention will be described in detail.

Figure 1:
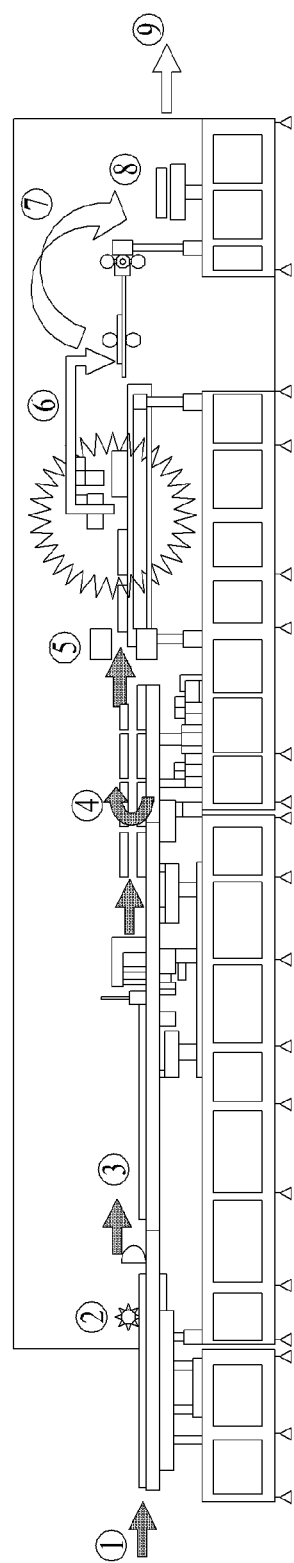
FIG. 1 is a view illustrating the flow of a process in a cutting penetrable scriber (CPS)

FIG. 1 is a view illustrating the flow of a process in a cutting penetrable scriber (CPS).

In FIG. 1, a scribing step of cutting upper and lower substrates, which are bonded, into liquid crystal display panels by the CPS, a step of separating the liquid crystal display panels from the bonded substrates and transferring the liquid crystal display panels using a separation and transfer unit provided with the absorber mounted thereon, and a grinding step are sequentially illustrated.

First, when the two substrates are bonded, the bonded substrates mounted on a cassette are transferred to the CPS in order to perform the scribing step using a scriber and the liquid crystal display panel separating step.

When the bonded substrates mounted on the cassette are loaded into the CPS (glass loading: ①), the bonded substrates are transferred to a conveyer in order to perform the scribing step (aligning/scribing: ③). At this time, prior to perform the scribing step, the bonded substrates are centered on the conveyer, and the number of the bonded substrates is checked using an optical character reader (OCR) (centering/OCR reading: ②). Thereafter, the substrates are transferred to the scribing step. In the scribing step (③), grooves are formed on the bonded substrates with a diamond cutter in order to separate the bonded substrates into the liquid crystal display panels. In order to form exact scribe lines, the bonded substrates are aligned prior to the scribing (aligning). When the scribing step (③) of cutting the aligned substrates has been completed, a steam breaking step (⑤) of spraying steam into cracks generated on the bonded substrates due to the scribing step is carried out to facilitate the separation of the substrates. In order to perform the steam breaking step, the substrates provided with the scribe lines are elevated to a steam breaking stage (④). When the steam breaking step (⑤) has been completed, a step (⑥) of separating a liquid crystal display panel from the bonded substrates is carried out, and then the separated liquid crystal display panel is reversed (⑦) and the alignment of the liquid crystal display panel and the removal of dummy glass are checked. Thereafter, a centering/curette removing step (⑧) of trimming the edge of the liquid crystal display panel is carried out, and the separated liquid crystal display panel is discharged to the outside of the CPS (⑨). At this time, when the steam breaking step has been completed, the bonded substrates are lifted up using the absorber attached to a transfer hand robot arm, and then the liquid crystal panel is separated from the bonded substrates and is transferred.

Figure 2:
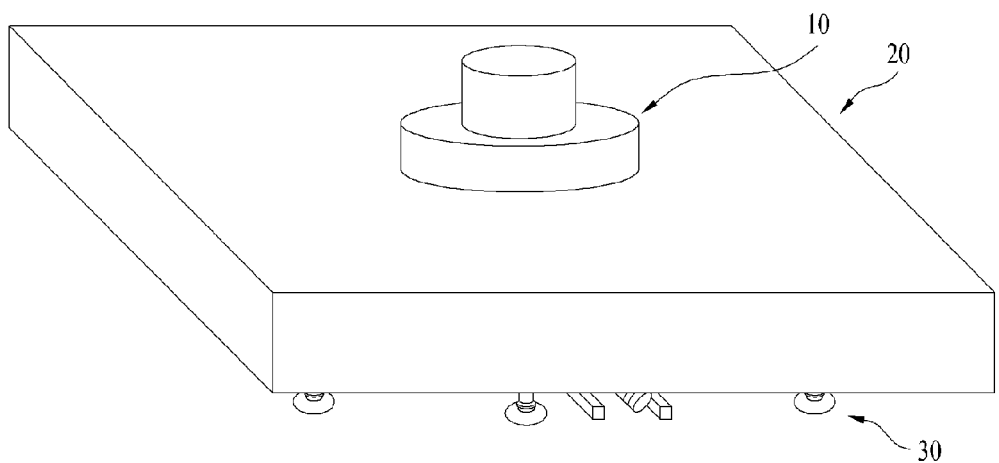
FIG. 2 is a view schematically illustrating an absorber in accordance with an embodiment of the present invention.
Figure 3:
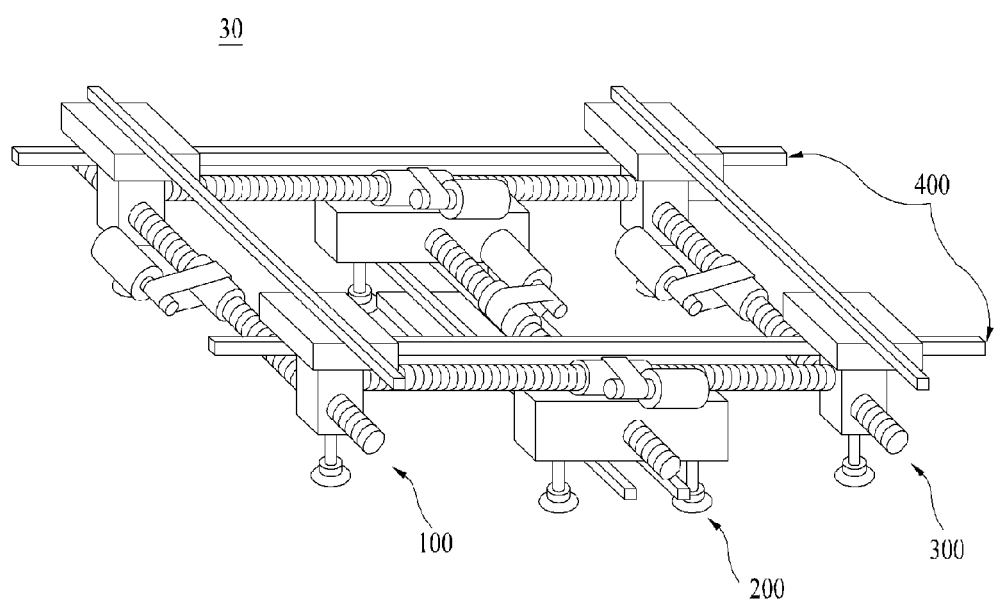
FIG. 3 is a detailed view illustrating an absorption unit assembly of FIG. 2.

FIG. 2 is a view schematically illustrating the absorber attached to the above-described transfer hand robot arm in accordance with an embodiment of the present invention, and FIG. 3 is a detailed view illustrating an absorption unit assembly of FIG. 2.

With reference to FIGS. 2 and 3, the absorber in accordance with the present invention includes an absorption plate 20 attached to the transfer hand robot arm through a turn unit 10, and an absorption unit assembly 30 mounted on the lower surface of the absorption plate 20 to adjust the positions of absorption pads according to sizes of liquid crystal display panels.

The absorption unit assembly 30 generally includes a left absorption unit 100, a middle absorption unit 200, a right absorption unit 300, and an absorption support unit 400.

Figure 4:
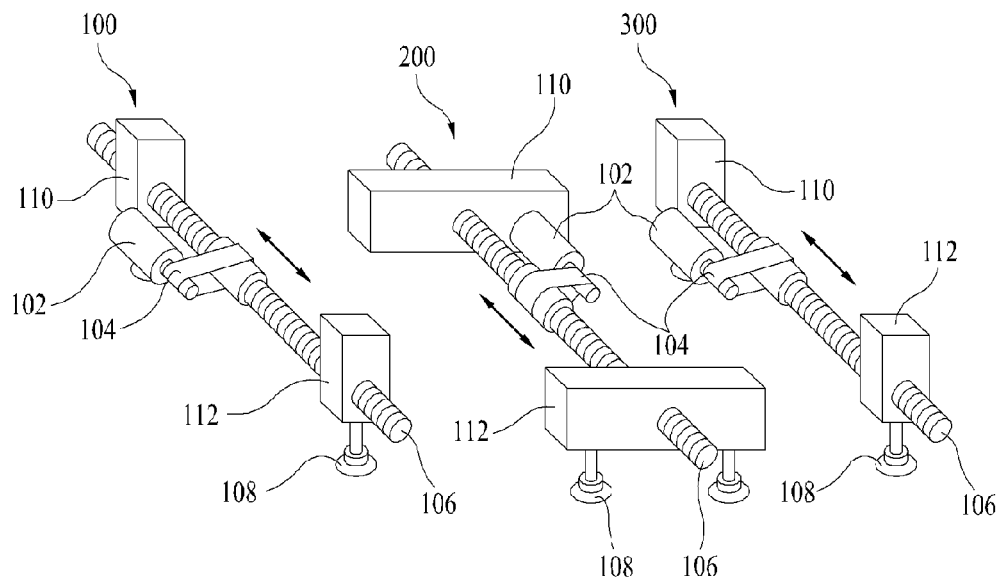
FIG. 4 is a view illustrating a left absorption unit, a middle absorption unit, and a right absorption unit of FIG. 3.
Figure 5:
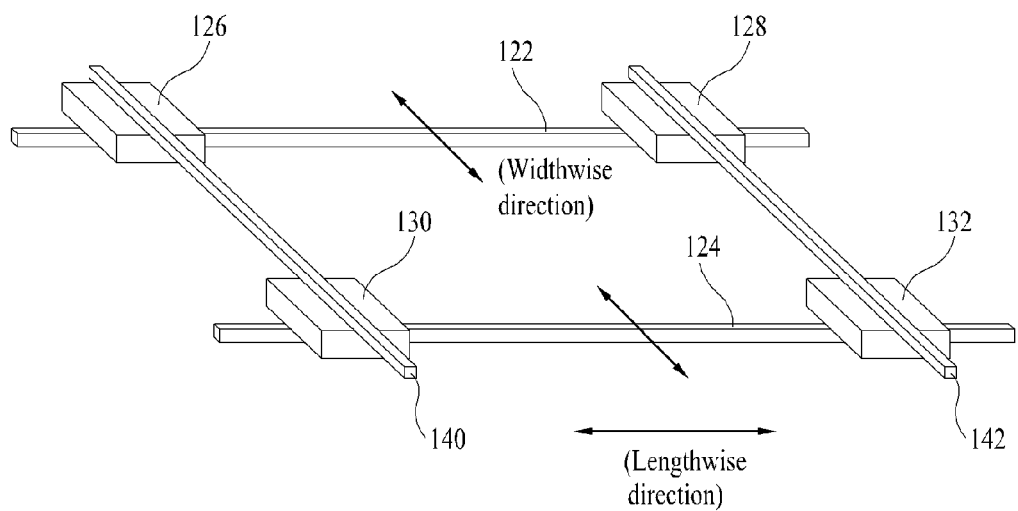
FIG. 5 is a view illustrating an absorption support unit of FIG. 3.

FIG. 4 is a view illustrating only the left absorption unit 100, the middle absorption unit 200, and the right absorption unit 300, which are separated from the absorption unit assembly 30 of FIG. 2, and FIG. 5 is a view illustrating only the absorption support unit 400, which is separated from the absorption unit assembly 30 of FIG. 4.

With reference to FIG. 4, each of the left absorption unit 100, the middle absorption unit 200, and the right absorption unit 300 includes a motor 102, a timing belt 104 connected to the motor 102, a ball screw 106 rotated according to the driving of the timing belt 104, and first and second absorption pad fixing parts 110 and 120 located at both sides of the ball screw 106 such that the positions of the first and second absorption pad fixing parts 110 and 120 are varied according to the rotation of the ball screw 106 and absorption pads 108 are fixed to the first and second absorption pad fixing parts 110 and 120.

The absorption support unit 400, as shown in FIG. 5, includes a first LM guide 122 installed on the first absorption pad fixing parts 110 of the left absorption unit 100 and the right absorption unit 300 of FIG. 4, a second LM guide 124 installed on the second absorption pad fixing parts 120 of the left absorption unit 100 and the right absorption unit 300, a first block 126 installed on the upper surface of the left side of the first LM guide 122 and being movable in the lengthwise direction of the first LM guide 122, a second block 128 installed on the upper surface of the right side of the first LM guide 122 and being movable in the lengthwise direction of the first LM guide 122, a third block 130 installed on the upper surface of left side of the second LM guide 124 and being movable in the lengthwise direction of the second LM guide 124, a fourth block 132 installed on the upper surface of the right side of the second LM guide 124 and being movable in the lengthwise direction of the second LM guide 124, a third LM guide 140 installed on the first and third blocks 126 and 130 and being perpendicular to the first and second LM guides 122 and 124, and a fourth LM guide 142 installed on the second and fourth blocks 128 and 132 and being perpendicular to the first and second LM guides 122 and 124.

Through the above configuration, the first and second blocks 126 and 128 are movable in the lengthwise direction (the lengthwise direction of the first and second LM guides) on the first LM guide 122, and are movable in the widthwise direction (the lengthwise direction of the third LM guide) by the third LM guide 140. Further, the third and fourth blocks 130 and 132 are movable in the lengthwise direction (the lengthwise direction of the first and second LM guides) on the second LM guide 124, and are movable in the widthwise direction (the lengthwise direction of the fourth LM guide) by the fourth LM guide 142. On the other hand, the upper surfaces of the third and fourth LM guides 140 and 142 are fixed to the absorption plate 20.

Figure 6:
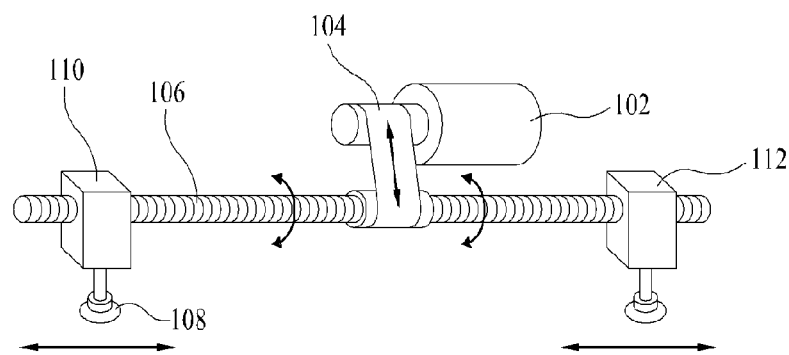
FIG. 6 is a view illustrating a process of operating internal elements of the left absorption unit, the middle absorption unit, and the right absorption unit.

FIG. 6 is a view illustrating the operating procedure of each of the left absorption unit 100, the middle absorption unit 200, and the right absorption unit 300.

With reference to FIG. 6, the motor 102 is rotated, the timing belt 104 connected to the motor 102 is driven by interlocking with the rotation of the motor 102, and the ball screw 106 is rotated by interlocking with the rotation of the timing belt 104. The positions of the first and second absorption pad fixing parts 110 and 112 are changed, i.e., the first and second absorption pad fixing parts 110 and 112 become close or distant in the widthwise direction, according to the rotation of the ball screw 106. Here, the change of the positions of the first and second absorption pad fixing parts 110 and 112 is adjusted according to the size of a liquid crystal display panel.

Hereinafter, with reference to FIGS. 7 and 8, a method of moving the absorption pads in the widthwise direction will be described.

Figure 7:
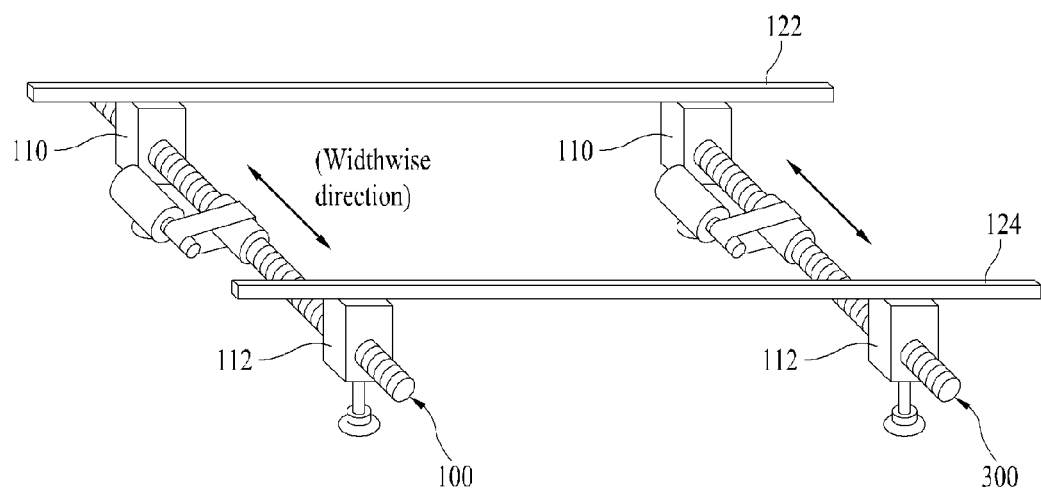
FIG. 7 is a view illustrating a method of moving the left absorption unit and the right absorption unit in the widthwise direction.

FIG. 7 is a view illustrating a method of moving the left absorption unit 100 and the right absorption unit 300 under the condition that the left absorption unit 100 and the right absorption unit 300 are fixed to the first LM guide 122 and the second LM guide 124.

With reference to FIG. 7, the first absorption pad fixing parts 110 of the left absorption unit 100 and the right absorption unit 300 are connected to the lower surface of the first LM guide 122, and the second absorption pad fixing parts 112 of the left absorption unit 100 and the right absorption unit 300 are connected to the lower surface of the second LM guide 124. Accordingly, when the left absorption unit 100 and the right absorption unit 300 are operated by the process shown in FIG. 6, the positions of the absorption pads 108 can be adjusted in the widthwise direction.

Figure 8:
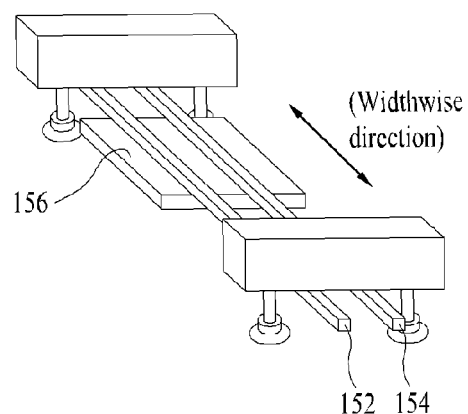
FIG. 8 is a view illustrating a method of moving the middle absorption unit.

FIG. 8 is a view illustrating a method of moving the middle absorption unit 200.

With reference to FIG. 8, in the middle absorption unit 200 differently from the left absorption unit 100 and the right absorption unit 300, fifth and sixth LM guides 152 and 154 are installed under the first and second absorption pad fixing parts 110 and 112, and a lower structure 156 to fix the fifth and sixth LM guides 152 and 154 is located under the fifth and sixth LM guides 152 and 154. The lower structure 156 is connected to the absorption plate 20 using a separate connector. The middle absorption unit 200 having the above configuration is movable also in the widthwise direction. That is, the fifth and sixth LM guides 152 and 154 are fixed to the lower structure 156, but the first and second absorption pad fixing parts 110 and 112 of the middle absorption unit 200 are movable in the widthwise direction on the fifth and sixth guides 152 and 154 by the operating method shown in FIG. 6.

Since the positions of the absorption pads 108 are adjusted in the widthwise direction according to sizes of liquid crystal display panels, as described above, the absorber of the present invention may be applied regardless of models of liquid crystal display panels.

Hereinafter, with reference to FIG. 9, a method of moving the absorption pads in the lengthwise direction will be described.

Figure 9:
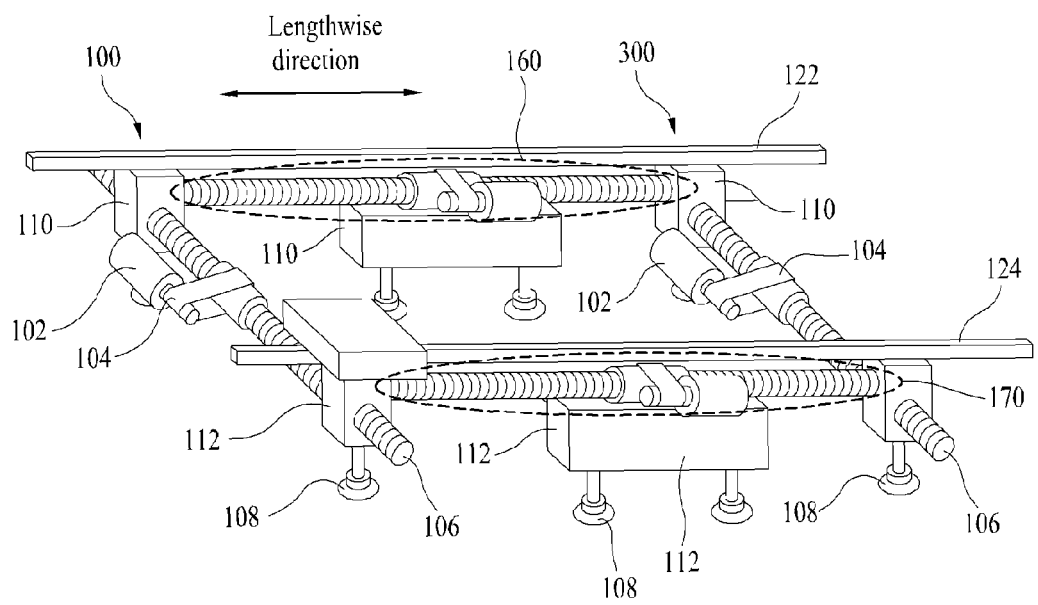
FIG. 9 is a view illustrating a method of moving the left absorption unit and the right absorption unit in the lengthwise direction.

With reference to FIG. 9, in order to move the absorption pads 108 of the absorber of the present invention in the lengthwise direction, first and second screw units 160 and 170 are further provided between the left and right absorption units 100 and 300.

More concretely, the first screw unit 160 is connected to the first absorption pad fixing part 110 of the left absorption unit 100 and the first absorption pad fixing part 110 of the right absorption unit 300, and the second screw unit 170 is connected to the second absorption pad fixing part 112 of the left absorption unit 100 and the second absorption pad fixing part 112 of the right absorption unit 300.

Each of the first and second screw units 160 and 170 includes a motor 102, a timing belt 104 connected to the motor 102, and a ball screw 106 rotated according to the driving of the timing belt 104. Here, the motors 102 and the ball screws 106 of the first and second screw units 160 and 170 may be connected to the absorption pad fixing parts 110 and 112 of the middle absorption unit 200.

These first and second screw units 160 and 170 are operated by the same method as the operating method shown in FIG. 6 except that the first and second screw units 160 and 170 move the first and second absorption pad fixing parts 110 and 112 in the lengthwise direction. That is, when the screws 106 are rotated by the operation of the motors 102, the first absorption pad fixing part 110 of the left absorption unit 100 and the first absorption pad fixing part 110 of the right absorption unit 300 become close or distant in the lengthwise direction, and simultaneously, the second absorption pad fixing part 112 of the left absorption unit 100 and the second absorption pad fixing part 112 of the right absorption unit 300 become close or distant in the lengthwise direction. Accordingly, it is possible to adjust the positions of the absorption pads 108 in the lengthwise direction.

Consequently, the positions of the absorption pads 108 of the absorber in accordance with the present invention are adjusted in the lengthwise direction by the first and second LM guides 122 and 124 and the first and second screw units 160 and 170, and are adjusted in the widthwise direction by the third and fourth LM guides 140 and 142. Thereby, it is unnecessary to separately manufacture absorbers, which respectively correspond to liquid crystal display panels having different sizes. Thus, the production cost of a liquid crystal display panel can be reduced.

In an absorber and an apparatus for fabricating a liquid crystal display panel having the same in accordance with the embodiment of the present invention, the positions of absorption pads are adjusted according to sizes of liquid crystal display panels. Thereby, it is unnecessary to separately manufacture absorbers, which respectively correspond to liquid crystal display panels having different sizes, and thus, the production cost of a liquid crystal display panel can be reduced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An absorber comprising:
   an absorption plate attached to a robot arm having a transfer hand through a turn unit; and
   an absorption unit assembly mounted on the lower surface of the absorption plate,
   wherein the absorption unit assembly includes:
   a middle absorption unit;
   a left absorption unit located at the left side of the middle absorption unit;
   a right absorption unit located at the right side of the middle absorption unit;
   an absorption support unit to guide moving routes of the absorption units and fix the absorption units to the absorption plate; and
   absorption pads respectively included on the absorption units such that the positions of the absorption pads are adjusted according to sizes of substrates to allow the absorption pads to absorb the substrates,
   wherein each of the absorption units includes:
   a motor;
   a timing belt driven according to the rotation of the motor;
   a ball screw rotated according to the driving of the timing belt; and
   first and second absorption pad fixing parts, to which the absorption pads are fixed, respectively located at both sides of the ball screw such that the positions of the first and second absorption pad fixing parts are varied according to the rotation of the ball screw.

2. The absorber according to claim 1, wherein the absorption support unit includes:
   a first LM guide installed on the first absorption pad fixing part of the left absorption unit and the first absorption pad fixing part of the right absorption unit;
   a second LM guide installed on the second absorption pad fixing part of the left absorption unit and the second absorption pad fixing part of the right absorption unit;
   a first block installed on the upper surface of the left side of the first LM guide and being movable in the lengthwise direction of the first LM guide;
   a second block installed on the upper surface of the right side of the first LM guide and being movable in the lengthwise direction of the first LM guide;
   a third block installed on the upper surface of the left side of the second LM guide and being movable in the lengthwise direction of the second LM guide;
   a fourth block installed on the upper surface of the right side of the second LM guide and being movable in the lengthwise direction of the second LM guide;
   a third LM guide installed on the first and third blocks and being perpendicular to the first and second LM guides; and
   a fourth LM guide installed on the second and fourth blocks and being perpendicular to the first and second LM guides.

3. The absorber according to claim 2, wherein the absorption support unit further includes:
   a first screw unit connected to the first absorption pad fixing part of the left absorption unit and the first absorption pad fixing part of the right absorption unit, and being parallel with the first and second LM guides; and
   a second screw unit connected to the second absorption pad fixing part of the left absorption unit and the second absorption pad fixing part of the right absorption unit, and being parallel with the first and second LM guides,
   wherein the first and second screw units move the absorption pads connected to the first and second absorption pad fixing parts in the lengthwise direction of the first and second LM guides according to the sizes of the substrates.

4. The absorber according to claim 3, wherein the first and second screw units move in the lengthwise direction of the third and fourth LM guides according to the sizes of the substrates by interlocking with the left and right absorption units.

5. The absorber according to claim 3, wherein:
   the central portion of the first screw unit is connected to the first absorption pad fixing part of the middle absorption unit; and
   the central portion of the second screw unit is connected to the second absorption pad fixing part of the middle absorption unit.

6. The absorber according to claim 1, wherein the middle absorption unit out of the absorption units further includes:
   fifth and sixth LM guides installed under the first and second absorption pad fixing parts, and being parallel with the ball screw; and
   a lower structure located under the fifth and sixth LM guides to fix the fifth and sixth LM guides.

* * * * *